(12) United States Patent
Liu et al.

(10) Patent No.: US 8,092,054 B2
(45) Date of Patent: Jan. 10, 2012

(54) LED ILLUMINATING DEVICE AND LIGHT ENGINE THEREOF

(75) Inventors: Tay-Jian Liu, Taipei Hsien (TW); Feng Tian, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 475 days.

(21) Appl. No.: 12/477,900

(22) Filed: Jun. 3, 2009

(65) Prior Publication Data
US 2010/0141108 A1    Jun. 10, 2010

(30) Foreign Application Priority Data
Dec. 8, 2008  (CN) .............................. 200810306048

(51) Int. Cl.
*B60Q 1/06* (2006.01)
(52) U.S. Cl. ............ 362/373; 313/46; 362/294; 362/234
(58) Field of Classification Search ............. 313/46; 362/234, 253, 294, 373
See application file for complete search history.

(56) References Cited

U.S. PATENT DOCUMENTS

| 7,434,964 | B1* | 10/2008 | Zheng et al. | 362/294 |
|---|---|---|---|---|
| 7,575,346 | B1* | 8/2009 | Horng et al. | 362/373 |
| 7,661,853 | B2* | 2/2010 | Kuo et al. | 362/373 |
| 7,748,876 | B2* | 7/2010 | Zhang et al. | 362/373 |
| 8,053,960 | B2* | 11/2011 | Liu et al. | 313/46 |
| 2005/0174780 | A1* | 8/2005 | Park | 362/294 |
| 2008/0144319 | A1* | 6/2008 | Chang et al. | 362/294 |
| 2009/0237937 | A1* | 9/2009 | Liu | 362/253 |
| 2009/0251901 | A1* | 10/2009 | Kuo et al. | 362/294 |
| 2009/0261707 | A1* | 10/2009 | Liu et al. | 313/46 |
| 2009/0268468 | A1* | 10/2009 | Liu | 362/294 |
| 2009/0303717 | A1* | 12/2009 | Long et al. | 362/249.02 |
| 2009/0323325 | A1* | 12/2009 | Long et al. | 362/234 |

FOREIGN PATENT DOCUMENTS

| CN | 2713301 Y | 7/2005 |
|---|---|---|
| CN | 201003740 Y | 1/2008 |
| CN | 101131232 A | 2/2008 |
| CN | 101294661 A | 10/2008 |

* cited by examiner

*Primary Examiner* — Nimeshkumar Patel
*Assistant Examiner* — Mary Ellen Bowman
(74) *Attorney, Agent, or Firm* — Altis Law Group, Inc.

(57) ABSTRACT

An LED illuminating device includes an optical section, an electrical section, and a heat dissipation section. The heat dissipation section is provided with a heat sink and at least one heat pipe therein. The heat sink includes a metal tube, a plurality of metal fins extending radially and outwardly from the metal tube, and a heat-absorbing plate attached to a bottom of the metal tube. A chamber is axially recessed from a top of the metal tube to the heat-absorbing plate. The heat pipe includes an evaporating section and a condensing section. The evaporating section of the heat pipe is attached to an inner surface of the heat-absorbing plate. The condensing section of the heat pipe is attached to an inner circumferential surface of the metal tube. The light source is attached to an outer surface of the heat-absorbing plate.

13 Claims, 8 Drawing Sheets

LED ILLUMINATING DEVICE AND LIGHT ENGINE THEREOF

BACKGROUND

1. Technical Field

Embodiments of the present invention generally relates to light emitting diode (LED) illuminating devices, and particularly to an LED illuminating device with a high heat dissipating efficiency and a light engine of the LED illuminating device.

2. Description of Related Art

Presently, LEDs (light emitting diodes) are preferred for use in LED illuminating devices rather than CCFLs (cold cathode fluorescent lamps) due to a high brightness, a long lifespan, and a wide color range of the LED.

For an LED, eighty percents to ninety percents of the power consumed by the LED is converted into thermal energy, and only ten percents to twenty percents of the power consumed by the LED is converted into light. In addition, a plurality of LEDs are generally packaged in a single LED illuminating device in order to obtain a desirable illumination brightness. Therefore, heat dissipation of the LED illuminating device is a problem inhibiting the application of the LED illuminating device, which requires to be resolved.

For a high brightness LED illuminating device, a highly efficient heat dissipation device is necessary in order to timely and adequately remove the heat generated by the LED illuminating device. Otherwise, the brightness, lifespan, and reliability of the LED illuminating device will be seriously affected. Conventional heat dissipation devices, such as heat sinks, can no longer satisfy the heat dissipation requirement of the high brightness LED illuminating device.

Therefore, it is desirable to provide an LED illuminating device with a high heat dissipating efficiency.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Reference will now be made to the drawing figures to describe the various embodiments in detail.

Figure 1:
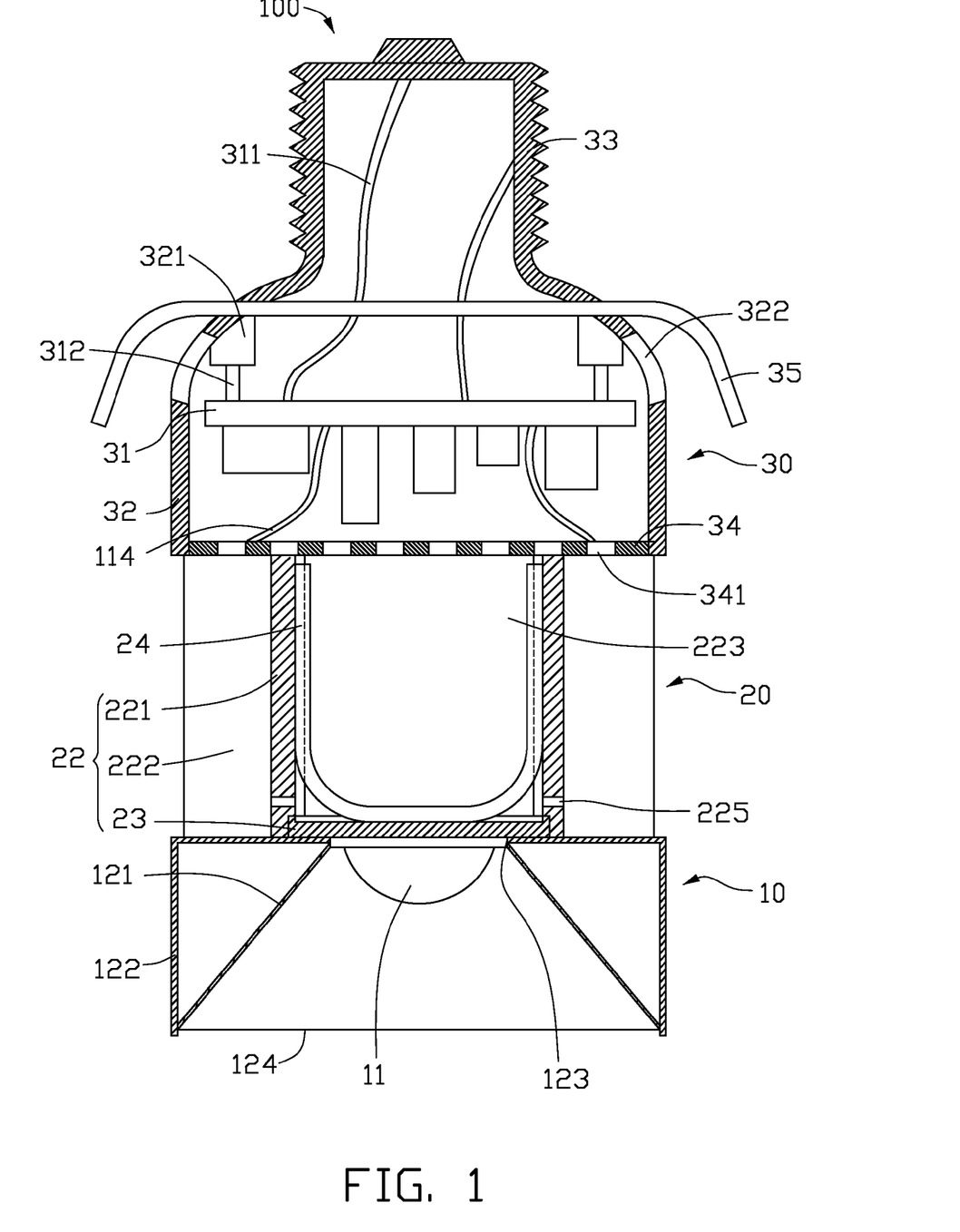
FIG. 1 is a cross-sectional view of an LED illuminating device in accordance with an exemplary embodiment of the present invention.
Figure 2:
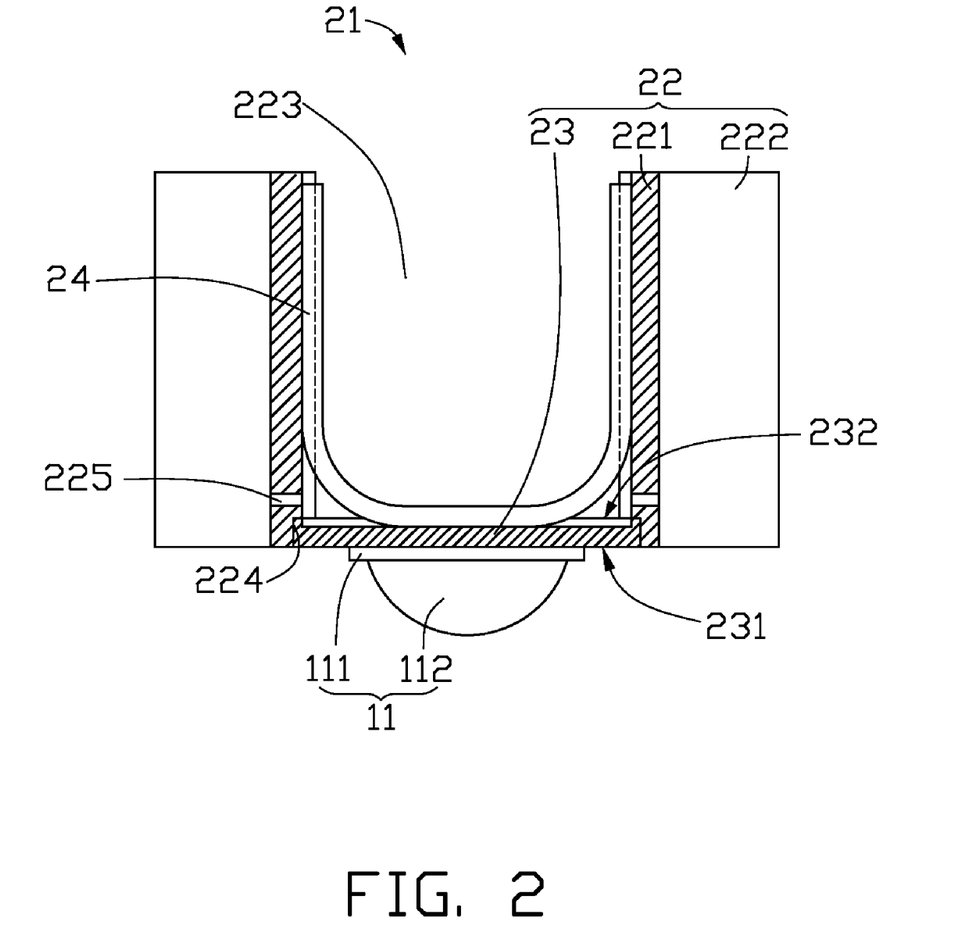
FIG. 2 is a light engine of the LED illuminating device of FIG. 1.

FIG. 1 is a cross-sectional view of an LED illuminating device 100 in accordance with an embodiment of the present invention. The LED illuminating device 100 includes an optical section 10, an electrical section 30, and a heat dissipation section 20 arranged between the optical section 10 and the electrical section 30. The LED illuminating device 100 is substantially cylindrical. The optical section 10 is located at a front end of the LED illuminating device 100, while the electrical section 30 is located at a rear end of the LED illuminating device 100.

The optical section 10 includes a housing 122, a light reflector 121, a light source 11, and an optical lens 124. A rear end of the housing 122 is coupled to the heat dissipation section 20, and a front end of the housing 122 is provided with the optical lens 124. The light reflector 121 and the light source 11 are received in the housing 122. The housing 122 provides protection for the light source 11 and the light reflector 121. The light reflector 121 is cone-shaped and tapers from the front end towards the rear end of the housing 122. The light reflector 121 has a rear end located adjacent to the heat dissipation section 20, and a front end mounted to the front end of the housing 122. The light reflector 121 and the optical lens 124 provide luminescence characteristics for the light source 11. An opening 123 is defined at the rear end of the light reflector 121 and the light source 11 is mounted at the opening 123. Light emitted by the light source 11 is reflected and guided by the light reflector 121 to an outside of the optical section 10 through the optical lens 124.

The electrical section 30 provides drive power, control circuit and power management for the light source 11. The electrical section 30 includes a casing 32 having a front end connected with the heat dissipation section 20, a lamp head 33 connected with a rear end of the casing 32, a partition plate 34 mounted at the front end of the casing 32, and a circuit board 31 received in the casing 32. A plurality of air passage holes 322 are radially defined through the casing 32 at a position adjacent to the lamp head 33. A dustproof cover 35 is provided over the air passage holes 322 for preventing dust from entering into an interior of the electrical section 30. The air passage holes 322 communicate the interior of the electrical section 30 with an outside environment and are utilized for dissipating heat of the circuit board 31. The partition plate 34 is defined with a plurality of air passage openings 341. The circuit board 31 is mounted in the casing 32 of the electrical section 30 through a plurality of mounting seats 321 and a plurality of mounting poles 312. The mounting seats 321 are attached to an inner surface of the casing 32. The mounting poles 312 connect the circuit board 31 with the mounting seats 321.

The electrical section 30 is further provided with a plurality of electrical wires 114, 311 connected with the circuit board 31. The electrical wires 114 extend through the partition plate 34 and electrically connect with the light source 11. The electrical wires 311 electrically connect with the lamp head 33, whereby the LED illuminating device 100 can get power from an external power source via the lamp head 33.

The heat dissipation section 20 is provided with a heat dissipation device. The heat dissipation device includes a heat sink 22 and a plurality of heat pipes 24 attached to the heat sink 22. The heat sink 22 is located between the housing 122 of the optical section 10 and the partition plate 34 of the electrical section 30. The heat dissipation device and the light source 11 cooperatively form a light engine 21 for the LED illuminating device 100.

Referring also to FIGS. 2-5, the heat sink 22 includes a metal tube 221, a plurality of metal fins 222 extending radially and outwardly from an outer circumferential surface 227 of the metal tube 221, and a heat-absorbing plate 23 attached to a bottom of the metal tube 221. The bottom of the metal tube 221 is sealed by the heat-absorbing plate 23. Particularly, an annular groove 224 is defined in the bottom of the metal tube 221 and the heat-absorbing plate 23 is fixedly embedded in the groove 224. Alternatively, the heat-absorbing plate 23 can be integrally formed with the metal tube 221 as a single piece. A top of the metal tube 221 is open, whereby a chamber 223 is axially defined in the metal tube 221. The chamber 223 extends from the top to the bottom of the metal tube 221.

The light source 11 is attached to an outer surface 231 of the heat-absorbing plate 23, whereby heat generated by the light source 11 is transferred to and effectively dissipated by the heat dissipation device. The light source 11 includes a substrate 111 forming electrical circuits thereon, and at least one LED 112 (light emitting diode) arranged on the substrate 111 and electrically connected to the electrical circuits. The substrate 111 is attached to the outer surface 231 of the heat-absorbing plate 23. The LED 112 is electrically connected with the electrical wires 114 of the electrical section 30 via the electrical circuits formed on the substrate 111. Alternatively, electrical circuits formed on the substrate 111 can be directly formed on the outer surface 231 of the heat-absorbing plate 23, and the LED 112 is directly attached to the outer surface 231 of the heat-absorbing plate 23, whereby the substrate 111 can be omitted and a heat resistance between the LED 112 and the heat-absorbing plate 23 is reduced. A layer of thermal interface material (TIM) may be applied between the substrate 111 and the outer surface 231 of the heat-absorbing plate 23 to eliminate an air interstice therebetween, to thereby enhance a heat conduction efficiency between the light source 11 and the heat-absorbing plate 23. Alternatively, the substrate 111 can be attached to the heat-absorbing plate 23 fixedly and intimately through surface mount technology (SMT).

Figure 3:
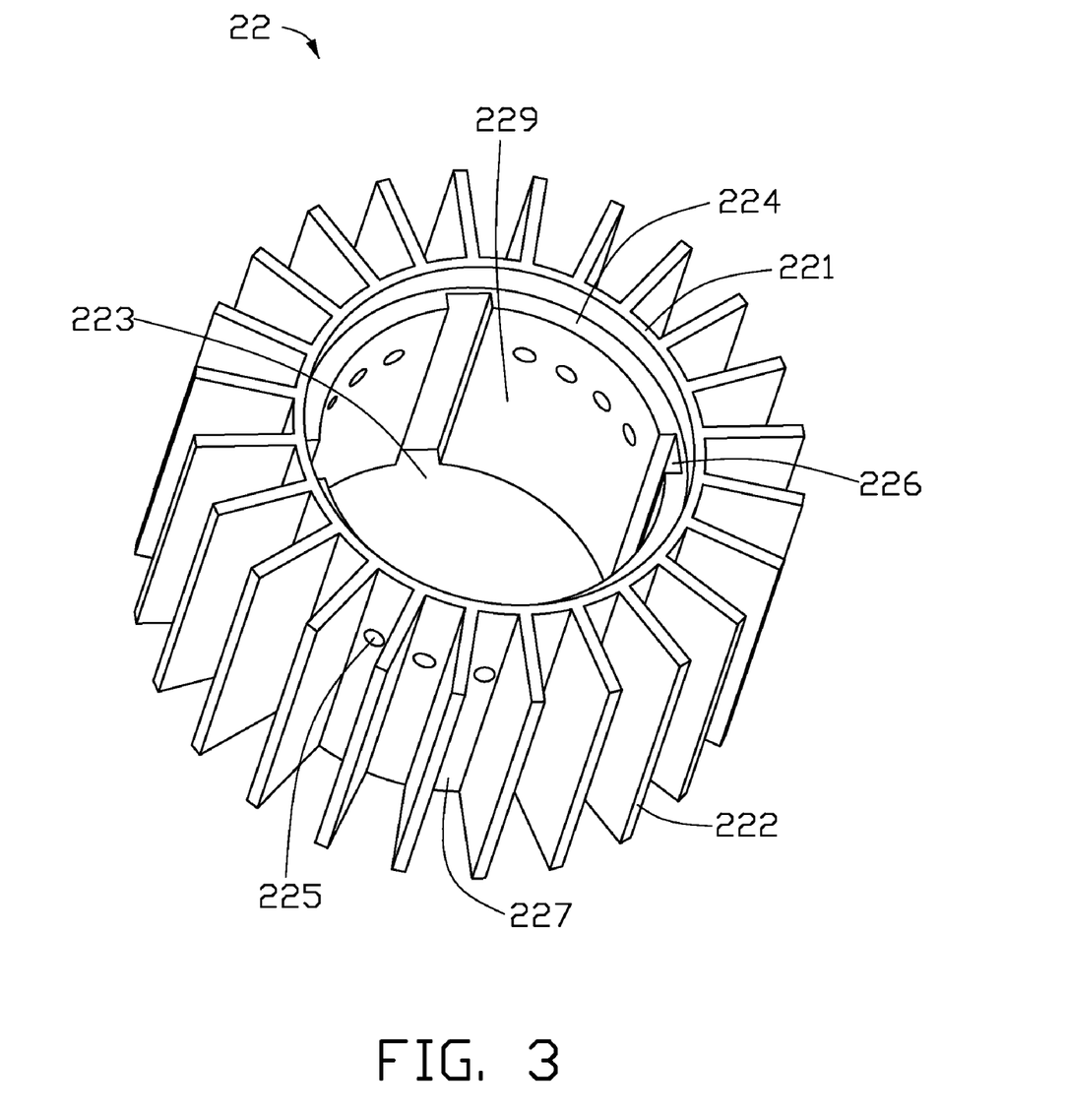
FIG. 3 is an isometric view of a heat sink of the light engine of FIG. 2, with a heat-absorbing plate of the heat sink removed.

A plurality of small-sized air passage holes 225 are radially and horizontally defined through a bottom end of the metal tube 221. The air passage holes 225 communicate the chamber 223 with an outside of the metal tube 221. A plurality of evenly spaced receiving grooves 226 are axially defined in an inner circumferential surface 229 of the metal tube 221. Each receiving groove 226 extends axially from a top end to the bottom end of the metal tube 221.

Figure 4:
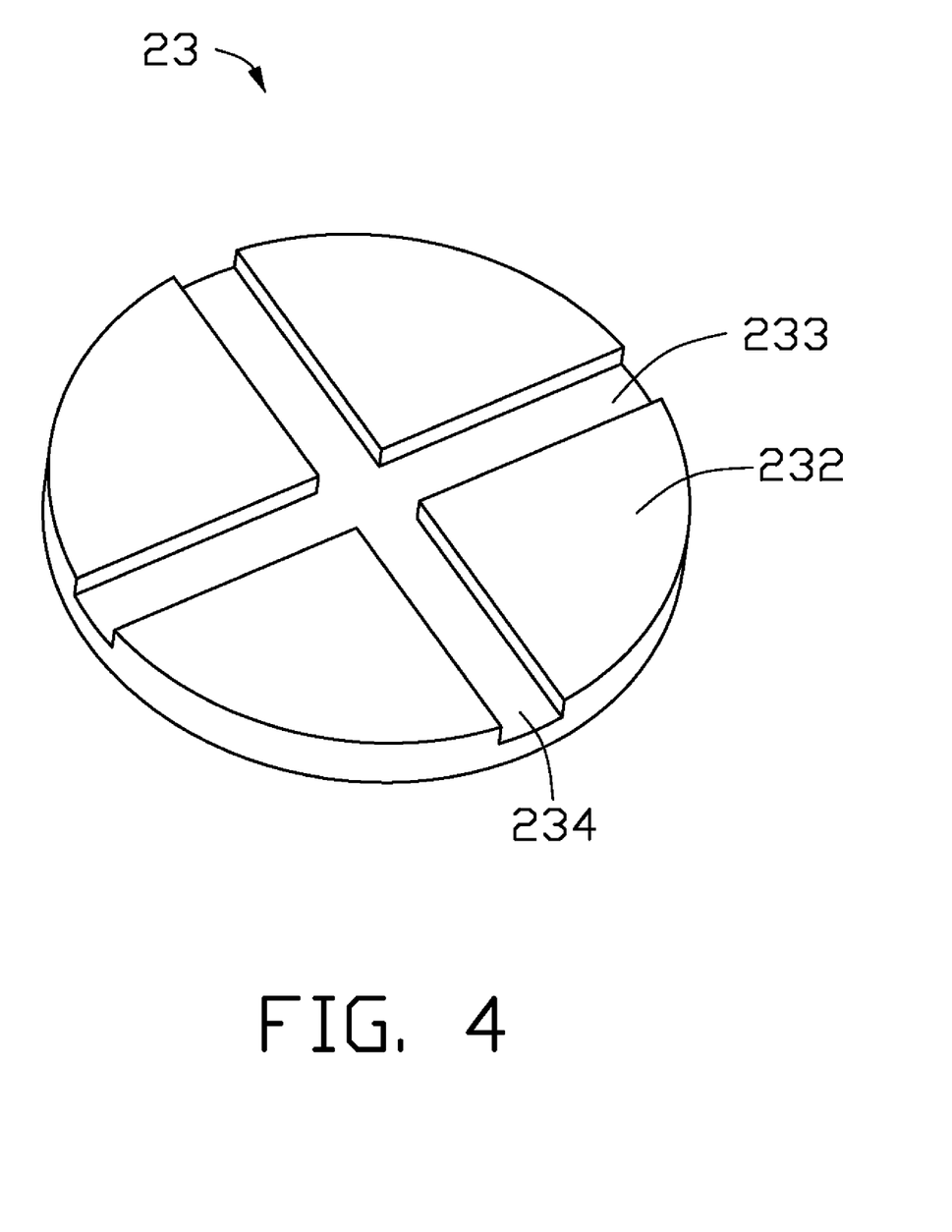
FIG. 4 is an isometric view of the heat-absorbing plate of the heat sink.
Figure 5:
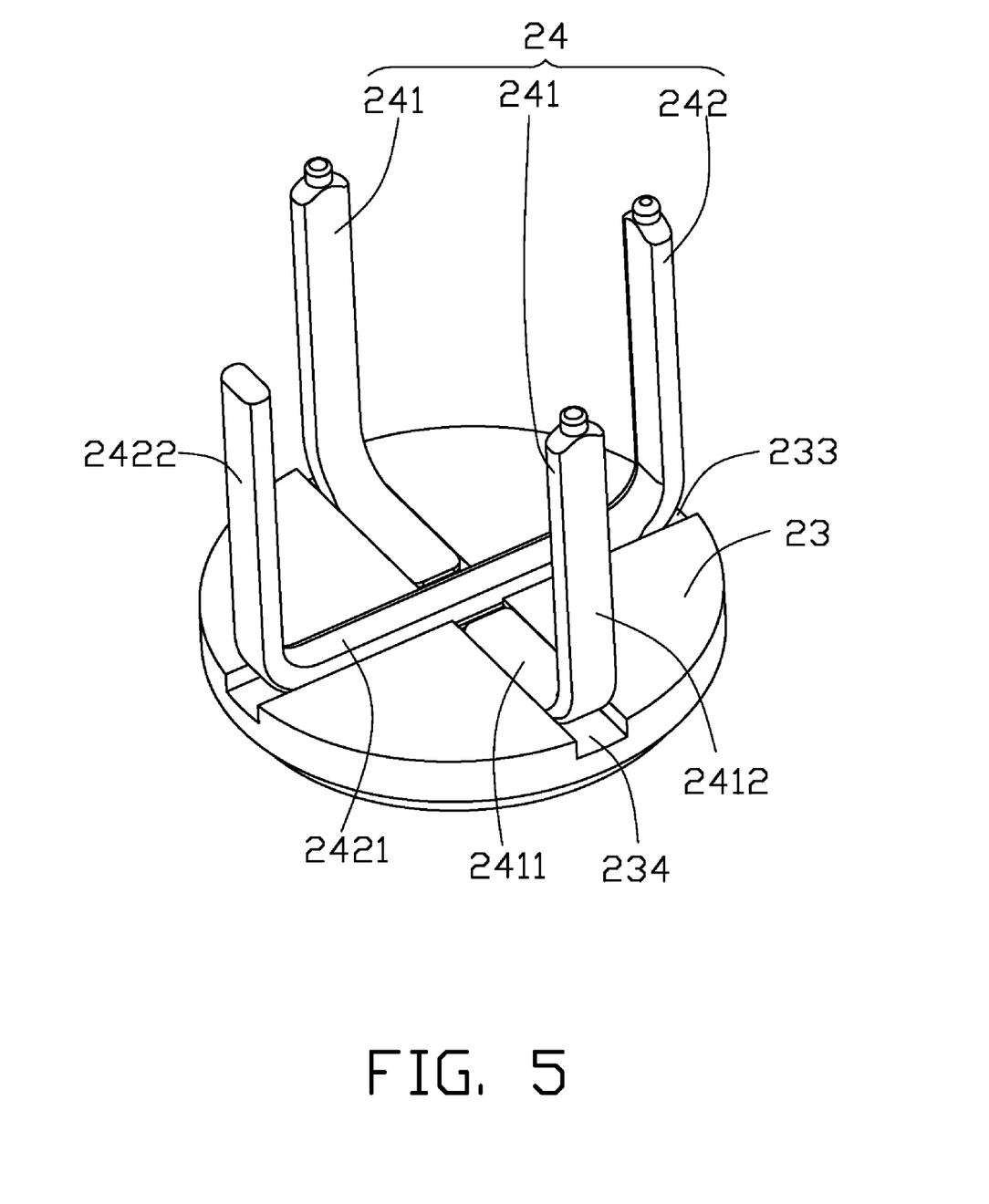
FIG. 5 is an isometric, assembled view of the heat-absorbing plate and a plurality of heat pipes.

A first mounting groove 233 and a second mounting groove 234 are defined in an inner surface 232 of the heat-absorbing plate 23. The first mounting groove 233 is perpendicular to the second mounting groove 234. The heat pipes 24 include two L-shaped heat pipes 241 and a U-shaped heat pipe 242. Each L-shaped heat pipe 241 includes an evaporating section 2411 and a condensing section 2412 perpendicular to the evaporating section 2411. The U-shaped heat pipe includes an evaporating section 2421 and two condensing sections 2422 extending perpendicularly from two opposite ends of the evaporating section 2421, respectively. The evaporating sections 2411 of the two L-shaped heat pipes 241 are received in the second mounting groove 234 of the heat-absorbing plate 23. The evaporating section 2421 of the U-shaped heat pipe 242 is received in the first mounting groove 233 of the heat-absorbing plate 23. Each of the condensing sections 2412, 2422 of the heat pipes 241, 242 is received in a corresponding receiving groove 226 of the metal tube 221. Particularly, the heat pipes 241, 242 are flat heat pipes so that the evaporating sections 2411, 2421 are fittingly received in the mounting grooves 233, 234 of the heat-absorbing plate 23 and the condensing sections 2412, 2422 are fittingly received in the receiving grooves 226 of the metal tube 221.

In operation, heat generated by the LED 112 is absorbed by the heat-absorbing plate 23. It is well known in the art that a heat pipe transfers heat under phase change of working fluid hermetically contained in the heat pipe. Therefore, the heat of the LED 112 is rapidly transferred from the heat-absorbing plate 23 to the heat sink 22 by the heat pipes 24. Air in the chamber 223 is heated by the heat of the LED 112 transferred to the heat sink 22 and flows upwardly. The heated, upwardly flowing air then enters into the electrical section 30 through the air passage openings 341 of the partition plate 34. The heated, upwardly flowing air finally escapes from the electrical section 30 to ambient atmosphere via the air passage holes 322 of the casing 32 of the electrical section 30. Cooling air in the ambient atmosphere enters into the chamber 223 via the air passage holes 225 of the metal tube 221, whereby a natural air convection is circulated in the LED illuminating device 100.

Figure 6:
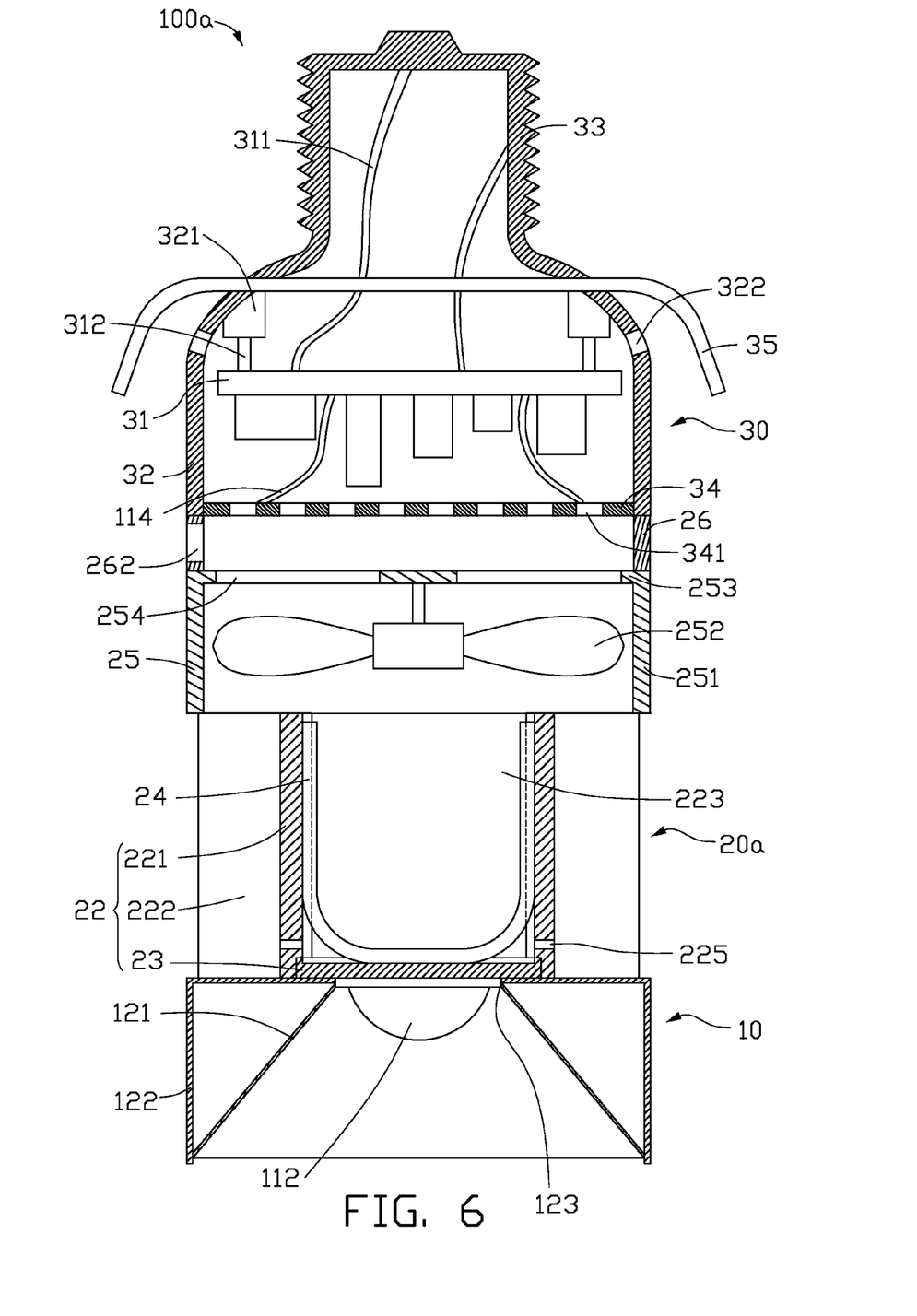
FIG. 6 is a cross-sectional view of an LED illuminating device in accordance with an alternative embodiment of the present invention.

Referring to FIG. 6, an LED illuminating device 100a according to an alternative embodiment of the present invention is illustrated. Except the following differences, the LED illuminating device 100a of the present embodiment is essentially the same as the LED illuminating device 100 shown in FIG. 1. In the present embodiment, a cooling fan 25 is provided in the heat dissipation section 20a and arranged over the heat sink 22. The cooling fan 25 is located between the heat sink 22 and the electrical section 30. The cooling fan 25 includes a fan housing 251 and a fan impeller 252 rotatably mounted to a top plate 253 of the fan housing 251. A plurality of air passage openings 254 are defined in the top plate 253 of the fan housing 251. An annular spacer 26 is interposed between the cooling fan 25 and the partition plate 34 of the electrical section 30. A plurality of air passage openings 262 are defined through a circumferential periphery of the spacer 26.

The cooling fan 25 can be configured to begin operation as soon as the LED 112 starts emitting light. Alternatively, the cooling fan 25 can be automatically activated to rotate when a junction temperature of the LED 112 reaches a specified temperature value after the LED 112 has worked for a particular time period, and the cooling fan 25 does not operate when the junction temperature of the LED 112 is below the specified temperature value. When the cooling fan 25 does not operate, air in the chamber 223 is heated by the heat of the LED 112 transferred to the heat sink 22 and flows upwardly. The heated, upwardly flowing air escapes to ambient atmosphere via the air passage openings 254 of the top plate 253 of the fan housing 251 and the air passage openings 262 of the spacer 26. Cooling air in the ambient atmosphere enters into the chamber 223 via the air passage holes 225 of the metal tube 221, whereby a natural air convection is circulated in the LED illuminating device 100a.

Figure 7:
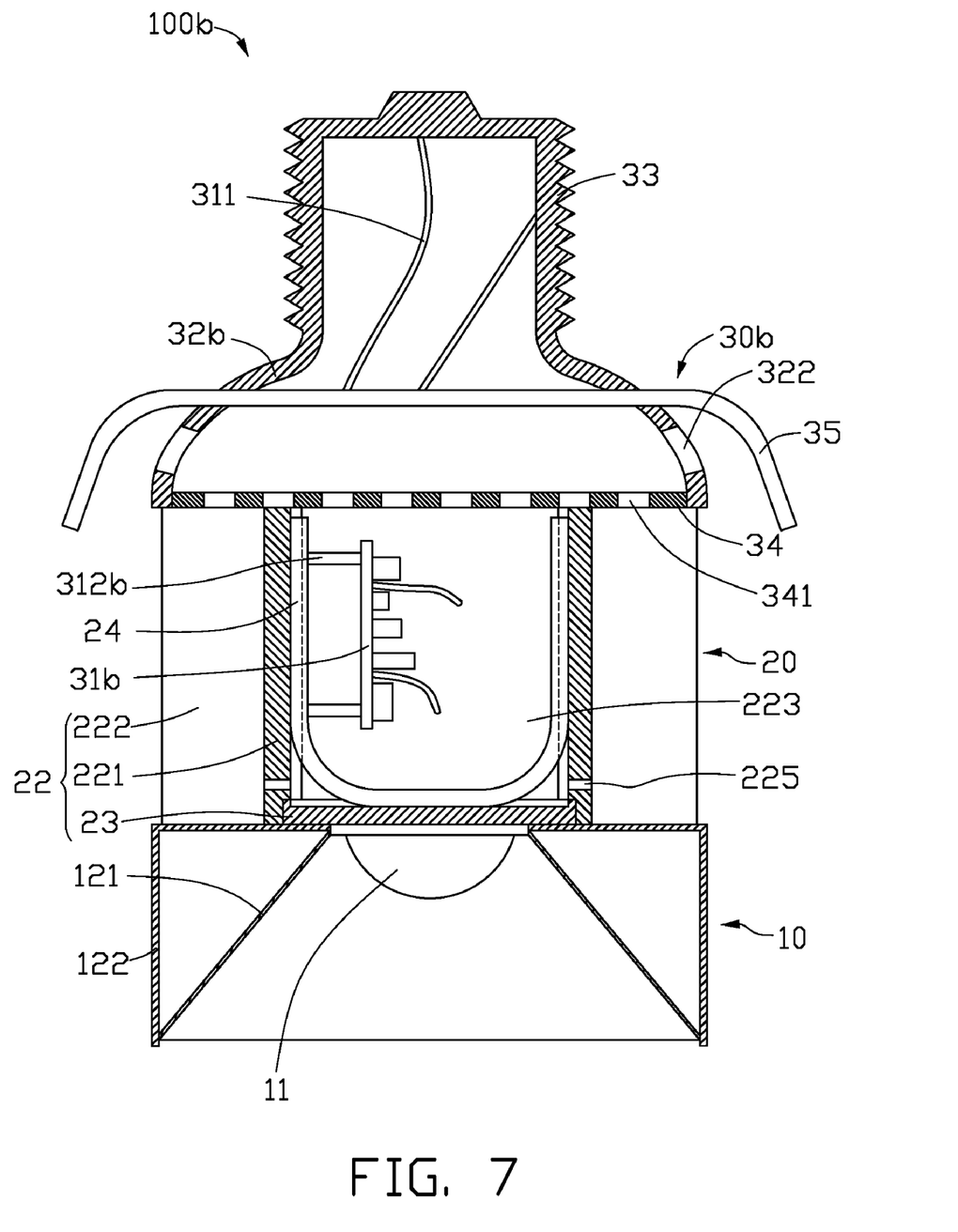
FIG. 7 is a cross-sectional view of an LED illuminating device in accordance with another alternative embodiment of the present invention.

When the cooling fan 25 operates, the cooling fan 25 inhales air from the ambient atmosphere via the air passage openings 262 of the spacer 26. The inhaled air then enters into the fan housing 251 via the air passage openings 254 of the top plate 253 of the fan housing 251. An airflow is therefore generated by the cooling fan 25 and flows towards the heat sink 22. A portion of the airflow flows into the chamber 223 of the metal tube 221, and further to the outside of the metal tube 221 through the air passage holes 225 defined in the bottom end of metal tube 221, whereby a forced air convection is circulated in the LED illuminating device 100a. Due to the presence of the chamber 223 and the air passage holes 225, the airflow can flow through an inside of the metal tube 221 to thereby increase a total heat exchange surface of the heat sink 22 with the airflow. The cooling fan 25 can be alternatively configured so that it generates an airflow which inhales the ambient air into the chamber 223 via the air passage holes 225; the ambient air is then exhausted out of the heat dissipation section 20a through the air passage openings 254 and the air passage openings 262. Referring to FIG. 7, an LED illuminating device 100b according to another alternative embodiment of the present invention is illustrated. Except the following differences, the LED illuminating device 100b of the present embodiment is essentially the same as the LED illuminating device 100 shown in FIG. 1. In the present embodiment, the circuit board 31b is moved from the casing 32b of the electrical section 30b to the chamber 223 of the metal tube 221 of the heat sink 22. Particularly, the circuit board 31b is received in the chamber 223 and fixed to the inner circumferential surface 229 of the metal tube 221 via mounting poles 312b, so that the circuit board 31b can be cooled by the heat sink 22. Since the circuit board 31b is removed away from the casing 32b, the electrical section 30b can have a shorter length whereby the LED illuminating device 100b can have a more compact structure.

Figure 8:
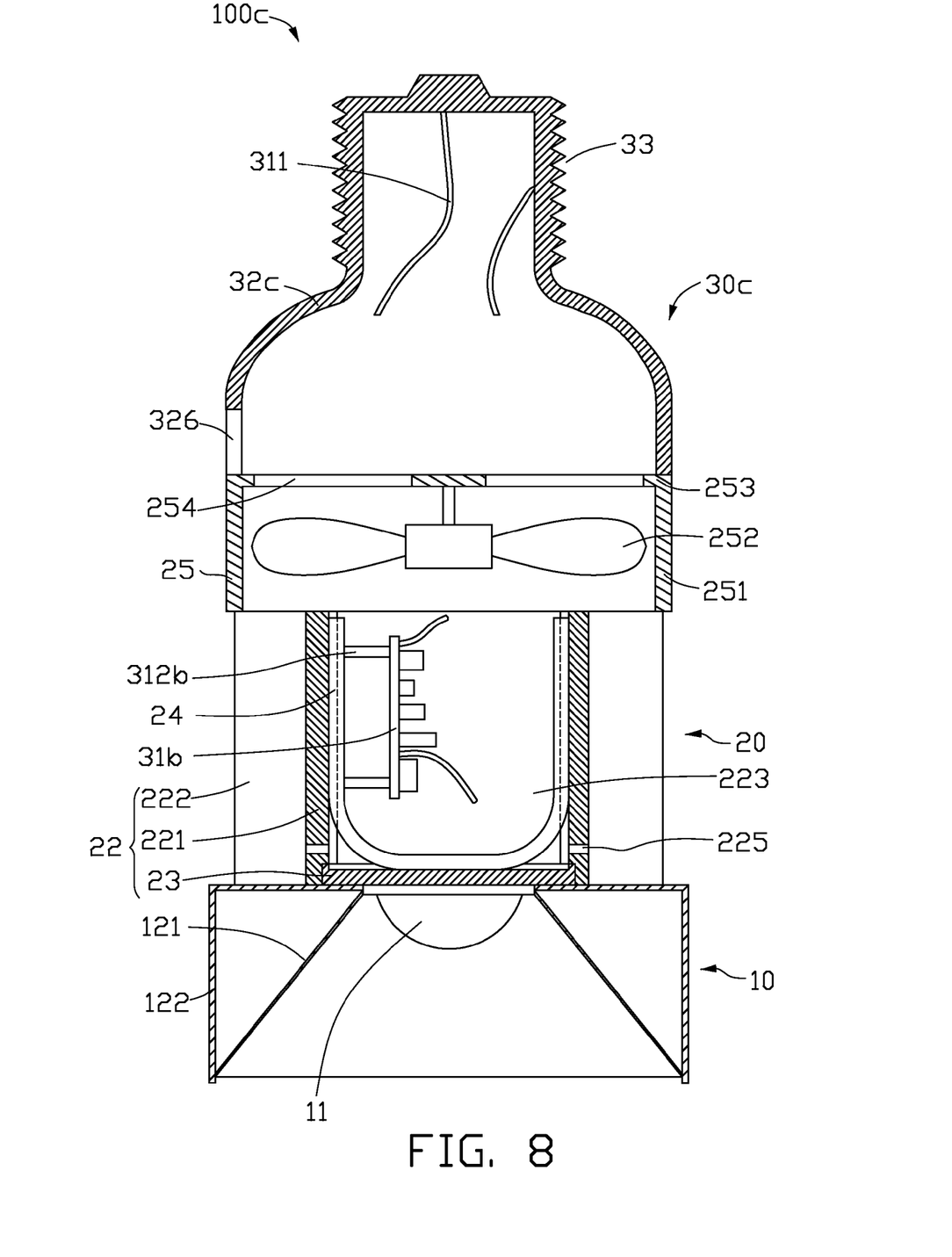
FIG. 8 is a cross-sectional view of an LED illuminating device in accordance with a further alternative embodiment of the present invention.

Referring to FIG. 8, an LED illuminating device 100c according to a further alternative embodiment of the present invention is illustrated. Similar to the LED illuminating device 100a shown in FIG. 6, a cooling fan 25 is provided and arranged over the heat sink 22 in the LED illuminating device 100c of the present embodiment. No spacer 26 is presented in the present embodiment. The top plate 253 of the cooling fan 25 is directly connected to a front end of the casing 32c of the electrical section 30c. A plurality of air passage openings 326 are radially defined through the front end of the casing 32c. The air passage openings 326 communicate an interior of the electrical section 30c with an outside environment. Similar to the LED illuminating device 100b shown in FIG. 7, the circuit board 31b is moved from the casing 32c of the electrical section 30c to the chamber 223 of the metal tube 221 of the heat sink 22. The circuit board 31b is received in the chamber 223 and fixed to the inner circumferential surface 229 of the metal tube 221 via mounting poles 312b.

When the cooling fan 25 does not operate, air in the chamber 223 is heated by the heat of the LED 112 transferred to the heat sink 22 and flows upwardly. The heated, upwardly flowing air from the chamber 223 enters into the fan housing 251, and then into the electrical section 30a via the air passage openings 254 defined in the top plate 253 of the fan housing 251. The heated, upwardly flowing air finally escapes to the ambient atmosphere via the air passage openings 326 defined in the casing 32c of the electrical section 30c. Cooling air in the ambient atmosphere enters into the chamber 223 via the air passage holes 225 defined in the bottom end of the metal tube 221, whereby a natural air convection is circulated in LED illuminating device 100c.

When the cooling fan 25 operates, the ambient air is inhaled into the electrical section 30c by the cooling fan 25 via the air passage openings 326 defined in the casing 32c. The inhaled air is then drawn by the cooling fan 25 from the electrical section 30c into the fan housing 251 via the air passage openings 254 defined in the top plate 253 of the fan housing 251. An airflow is therefore generated by the cooling fan 25 and flows towards the heat sink 22. A portion of the airflow flows into the chamber 223 of the metal tube 221, and further to the outside of the metal tube 221 through the air passage holes 225 defined in the bottom end of the metal tube 221, whereby a forced air convection is circulated through the heat sink 22. The cooling fan 25 can be alternatively configured so that the ambient air is inhaled into the chamber 223 via the air passage holes 225, the ambient air is then driven to move from the chamber 223 into the electrical section 30c through the air passage openings 254, and finally the ambient air is exhausted out of the electrical section 30c through the air passage openings 326.

It is to be understood, however, that even though numerous characteristics and advantages of the present invention have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED illuminating device, comprising:
an optical section being provided with a light source therein;
an electrical section being electrically connected with the light source; and
a heat dissipation section located between the optical section and the electrical section, the heat dissipation section being provided with a heat sink and at least one heat pipe therein, the heat sink comprising a metal tube, a plurality of metal fins extending radially and outwardly from an outer circumferential surface of the metal tube, and a heat-absorbing plate attached to a bottom of the metal tube, a top of the metal tube being open and facing the electrical section, a chamber being axially defined in the metal tube and extending from the top to the bottom of the metal tube, the at least one heat pipe comprising an evaporating section and a condensing section, the at least one heat pipe being received in the chamber of the metal tube, the evaporating section of the at least one heat pipe being attached to an inner surface of the heat-absorbing plate, the condensing section of the at least one heat pipe being attached to an inner circumferential surface of the metal tube, the light source being attached to an outer surface of the heat-absorbing plate; wherein a plurality of air passage holes are radially defined through the metal tube at a position above and near the heat-absorbing plate, the air passage holes communicating the chamber with an outside of the metal tube.

2. The LED illuminating device of claim 1, wherein the electrical section comprises a casing, a partition plate is arranged between the electrical section and the heat dissipation section, a plurality of air passage openings are provided through the partition plate, and a plurality of air passage holes are provided through a circumferential periphery of the casing.

3. The LED illuminating device of claim 1, wherein a cooling fan is provided over the heat sink and configured to generate an airflow through the heat sink, a spacer is provided between the cooling fan and the electrical section, a plurality of air passage openings are defined radially through a circumferential periphery of the spacer, and the airflow flows through the air passage openings of the spacer, the chamber and the air passage holes of the metal tube.

4. The LED illuminating device of claim 1, wherein the electrical section comprises a casing, a cooling fan is provided over the heat sink and configured to generate an airflow through the heat sink, a plurality of air passage openings are defined radially through a circumferential periphery of the casing, and the airflow flows through the air passage openings of the casing, the chamber and the air passage holes of the metal tube.

5. The LED illuminating device of claim 1, wherein a circuit board is received in the chamber of the metal tube, and the light source is electrically connected with the circuit board.

6. The LED illuminating device of claim 1, wherein at least one mounting groove is defined in the inner surface of the heat-absorbing plate, at least one receiving groove is defined in the inner circumferential surface of the metal tube, and the evaporating section and the condensing section of the at least one heat pipe are fittingly received in the at least one mounting groove and the at least one receiving groove, respectively.

7. The LED illuminating device of claim 6, wherein the at least one heat pipe comprises a U-shaped heat pipe and two L-shaped heat pipes.

8. The LED illuminating device of claim 1, wherein an annular groove is defined in the bottom of the metal tube and the heat-absorbing plate is fixedly embedded in the annular groove.

9. The LED illuminating device of claim 1, wherein the optical section comprises a housing, a light reflector, and an optical lens, the housing receives the light reflector and the light source therein, and light emitted by the light source is reflected and guided by the light reflector to an outside of the optical section through the optical lens.

10. A light engine of an LED illuminating device, comprising:
a light source;
a heat sink comprising a metal tube, a plurality of metal fins extending radially and outwardly from an outer circumferential surface of the metal tube, and a heat-absorbing plate attached to a bottom of the metal tube, a top of the metal tube being open, a chamber being axially defined in the metal tube and extending from the top to the bottom of the metal tube, the light source being attached to an outer surface of the heat-absorbing plate; and
at least one heat pipe comprising an evaporating section and a condensing section, the at least one heat pipe being received in the chamber of the metal tube, the evaporating section of the at least one heat pipe being attached to an inner surface of the heat-absorbing plate, the condensing section of the at least one heat pipe being attached to an inner circumferential surface of the metal tube; wherein a plurality of air passage holes are radially defined through the metal tube at a position above and near the heat-absorbing plate, the air passage holes communicating the chamber with an outside of the metal tube.

11. The light engine of the LED illuminating device of claim 10, further comprising a cooling fan provided over the heat sink and configured to generate an airflow through the heat sink, the airflow flowing through the chamber and the air passage holes of the metal tube.

12. The light engine of the LED illuminating device of claim 10, wherein at least one mounting groove is defined in the inner surface of the heat-absorbing plate, at least one receiving groove is defined in the inner circumferential surface of the metal tube, and the evaporating section and the condensing section of the at least one heat pipe are fittingly received in the at least one mounting groove and the at least one receiving groove, respectively.

13. The light engine of the LED illuminating device of claim 12, wherein the at least one heat pipe comprises a U-shaped heat pipe and two L-shaped heat pipes.

* * * * *